(12) United States Patent
Yoshinaga

(10) Patent No.: US 7,872,255 B2
(45) Date of Patent: Jan. 18, 2011

(54) ORGANIC LIGHT-EMITTING DEVICE

(75) Inventor: Hideki Yoshinaga, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 880 days.

(21) Appl. No.: 11/691,696

(22) Filed: Mar. 27, 2007

(65) Prior Publication Data

US 2007/0228380 A1   Oct. 4, 2007

(30) Foreign Application Priority Data

Mar. 29, 2006  (JP) .............................. 2006-091226
Feb. 9, 2007  (JP) .............................. 2007-030727

(51) Int. Cl.
*H01L 29/08* (2006.01)
*H01L 51/00* (2006.01)

(52) U.S. Cl. ................................ 257/40; 257/E51.018

(58) Field of Classification Search .................... 257/40, 257/84, E51.018, E51.022; 438/27, 30, 99, 438/155

See application file for complete search history.

(56) References Cited

U.S. PATENT DOCUMENTS

| | | | |
|---|---|---|---|
| 6,049,167 A | | 4/2000 | Onitsuka et al. ............ 313/512 |
| 6,933,533 B2 * | | 8/2005 | Yamazaki et al. ............. 257/88 |
| 7,221,095 B2 * | | 5/2007 | Yamazaki et al. ........... 313/509 |
| 2004/0012550 A1 * | | 1/2004 | Koyama ....................... 345/76 |
| 2005/0001543 A1 * | | 1/2005 | Nomura et al. ............. 313/504 |
| 2007/0001590 A1 * | | 1/2007 | Tateishi et al. .............. 313/504 |
| 2007/0046191 A1 * | | 3/2007 | Saito .......................... 313/506 |
| 2008/0038881 A1 * | | 2/2008 | Shin et al. ................... 438/149 |
| 2009/0124080 A1 * | | 5/2009 | Shigeoka et al. ............ 438/675 |

FOREIGN PATENT DOCUMENTS

| JP | 10-233283 | 9/1998 |
|---|---|---|
| JP | 2002-134271 | 5/2002 |

* cited by examiner

*Primary Examiner*—Julio J Maldonado
*Assistant Examiner*—Christine Enad
(74) *Attorney, Agent, or Firm*—Fitzpatrick, Cella, Harper & Scinto

(57) ABSTRACT

An organic light-emitting device includes an electron injection layer and an element isolation layer. The electron injection layer contains at least one of an alkali metal, an alkaline earth metal, an alkali metal compound, or an alkaline earth metal compound. A layer having the same composition of the electron injection layer is disposed over the electron injection layer in a region surrounding the light-emitting region.

14 Claims, 3 Drawing Sheets

ORGANIC LIGHT-EMITTING DEVICE

BACKGROUND OF THE INVENTION

1. Field of the Invention

The present invention relates to organic light-emitting devices.

2. Description of the Related Art

Organic light-emitting elements (organic EL elements), which are a type of self-light-emitting device, have received attention for flat panel displays. The organic light-emitting element is of a self-emitting type and does not use a backlight. Accordingly, the organic light-emitting element provides a thinner display. In addition, the organic light-emitting element has a high visibility and a wide color reproduction area. Extensive research has been conducted for a commercial product using organic light-emitting elements. In-car component stereo systems, cellular phones, and the like already use organic light-emitting elements as their display elements.

An organic light-emitting element includes an organic light-emitting substrate including a pair of opposing electrodes composed of an anode and a cathode, and an organic light-emitting layer between the electrodes on a substrate such as a glass plate or a film. The external surface of the organic light-emitting element substrate is provided with a sealing layer. In order to extract light from the organic light-emitting layer to the outside, the electrode through which the light is extracted is made of a transparent material, such as ITO (indium tin oxide). The organic light-emitting element emits light by applying a voltage with an external driving circuit. A light-emitting region is formed by a plurality of such organic light-emitting elements arranged on the surface of a substrate so that many images can be displayed.

It is known that conventional organic light-emitting elements are not resistant to water. If, for example, water enters an organic light-emitting element, a dark spot, from which light is not emitted, may be produced in the organic light-emitting element substrate. Even if such a non-light-emitting region does not occur, the light emitting characteristics may change, which results in reduced luminance. This is disadvantageous since it also reduces lifetime.

In order to prevent water in the atmosphere from penetrating the organic light-emitting element and reducing lifetime, some approaches have been proposed. For example, Japanese Patent No. 3,288,242 discloses that a flat glass plate can be provided as the sealing layer on the external surface of an organic EL substrate with a cationic UV curable resin. Japanese Patent Laid-Open No. 2002-134271 discloses a multilayer barrier structure used as the sealing layer of an organic EL element.

In general, an organic light-emitting device includes a planarizing layer that flattens the unevenness resulting from the formation of thin film transistors (hereinafter referred to as TFTs) or the like. The planarizing layer is made of a polymer that can form a highly flat surface. The organic light-emitting device also includes an element isolation layer that isolates a plurality of organic light-emitting elements from each other. The element isolation layer is typically made of a polymer or an inorganic insulating material. Polymers used for these layers include acrylic resin and polyimide resin, and the inorganic insulating material may be silicon nitride or the like. Such a polymer contains more water than inorganic materials, and the water is liable to be left in the planarizing layer (resin layer) and the element isolation layer. Consequently, the water remaining in the planarizing layer (resin layer) and the element isolation layer degrades the organic compound layer of the organic light-emitting element. Even if the element isolation layer is made of an inorganic insulating material, the water in the planarizing layer (resin layer) may penetrate through a crack in the element isolation layer to degrade the organic compound layer.

The portions of the planarizing layer (resin layer) and element isolation layer disposed around the light emitting region are formed with a large width in the in-plane direction so as to permit variations in the in-plane direction of vapor deposition for forming the organic compound layer, or so as to protect a circuit disposed around the light-emitting region. Since the planarizing layer (resin layer) and the element isolation layer are wider around the light-emitting region, the amount of water remaining in these layers increases. The outer area of the light-emitting region is more seriously affected by the water than the middle area of the light emitting region. Thus, the degradation of the organic light-emitting element is pronounced particularly in the outer area of the light-emitting region.

SUMMARY OF THE INVENTION

The present invention provides an organic light-emitting device whose performance can be prevented from deteriorating, particularly in the outer area of the light-emitting region.

According to an aspect of the invention, an organic light-emitting device is provided which includes a base, a plurality of thin film transistors disposed on the base, a resin layer disposed on the thin film transistors, a plurality of organic light-emitting elements disposed to form a light-emitting region on the resin layer, an element isolation layer disposed on the resin layer, having a plurality of openings in which the respective organic light-emitting elements are disposed, and a hygroscopic layer. Each organic light-emitting element includes an anode, an organic compound layer including a light-emitting layer and an electron injection layer, and a cathode in contact with the electron injection layer. The electron injection layer contains at least one of an alkali metal, an alkaline earth metal, an alkali metal compound, or an alkaline earth metal compound. The hygroscopic layer has the same composition as the electron injection layer and is disposed over the element isolation layer in a region surrounding the light-emitting region.

According to another aspect of the invention, an organic light-emitting device is provided which includes a base, a plurality of organic light-emitting elements disposed to form a light-emitting region on a surface of the base, an element isolation layer made of resin disposed on the base, having a plurality of openings in which the respective organic light-emitting elements are disposed, and a hygroscopic layer. Each organic light-emitting element includes an anode, an organic compound layer including a light-emitting layer and an electron injection layer, and a cathode in contact with the electron injection layer. The electron injection layer contains at least one of an alkali metal, an alkaline earth metal, an alkali metal compound, or an alkaline earth metal compound. The hygroscopic layer has the same composition as the electron injection layer and is disposed over the element isolation layer in a region surrounding the light-emitting region.

In the organic light-emitting device, the outer area of the light-emitting region can be prevented from being affected by water remaining in the element isolation layer or the resin layer or planarizing layer. Thus, degradation can be reduced and, especially, degradation which is particularly pronounced in the outer area of the light-emitting region.

Further features of the present invention will become apparent from the following description of exemplary embodiments with reference to the attached drawings.

DESCRIPTION OF THE EMBODIMENTS

Figure 1A:
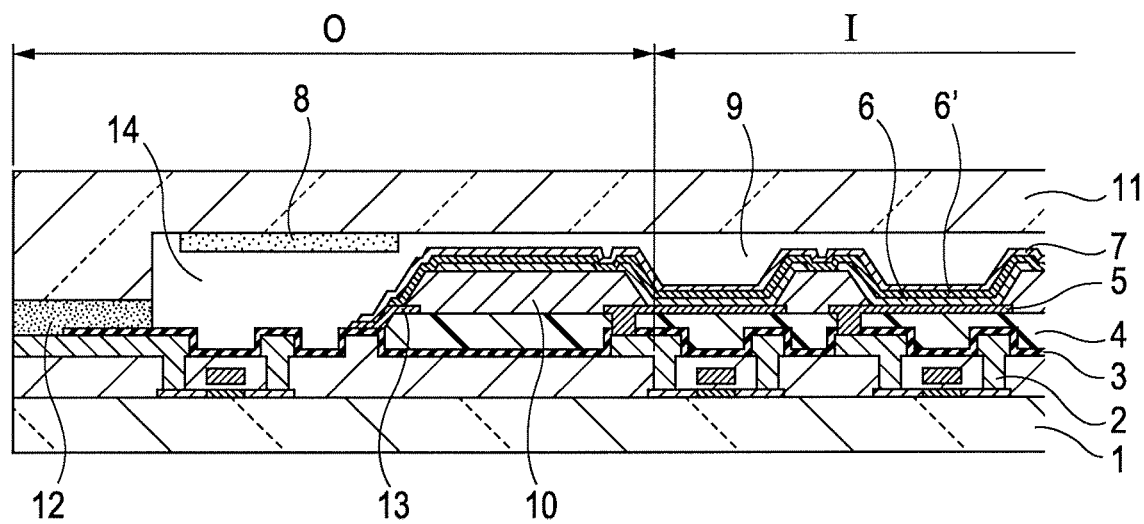
FIG. 1A is a schematic sectional view of an end of an organic light-emitting device according to an embodiment of the present invention.

An organic light-emitting device according to an embodiment of the invention includes a base, a plurality of organic light-emitting elements arranged on the base, and an element isolation layer formed on the base and insulating the organic light-emitting elements from each other. If thin film transistors are provided to control the light emission of the organic light-emitting elements, the organic light-emitting device further includes a resin layer to planarize or flatten the unevenness resulting from the presence of the thin film transistors. In this instance, the resin layer is formed between the thin film transistors and the organic light-emitting elements. Each organic light-emitting element includes an anode, an organic compound layer including a light-emitting layer and an electron injection layer, and a cathode in contact with the electron injection layer. The organic compound layer contains at least one element or compound selected from alkali metals, alkaline earth metals, alkali metal compounds, or alkaline earth metal compounds. The element isolation layer has a plurality of openings on the surface of the base, and the organic light-emitting elements are disposed in the respective openings to form a light-emitting region. A layer (hereinafter referred to as hygroscopic layer) having the same composition as the electron injection layer is formed over the element isolation layer around the light-emitting region.

The electron injection layer contains at least one element or compound selected from alkali metals, alkaline earth metals, alkali metal compounds, or alkaline earth metal compounds. These materials can enhance electron injection and easily absorb water.

By disposing the hygroscopic layer having the same composition as the electron injection layer over the element isolation layer in the region surrounding the light-emitting region, the hygroscopic layer absorbs the water contained in the element isolation layer and the resin layer. Thus, damage to the organic compound layer or the like of the organic light-emitting element can be alleviated. As a result, the degradation in the outer area of the light-emitting region can be reduced, so that high-quality light emission can be achieved over a long term. The region surrounding the light-emitting region (hereinafter referred to as the light-emitting region-surrounding region or the surrounding region) does not refer to regions between the plurality of organic light-emitting elements, but a region closer to the edges of the light-emitting device than to the light-emitting region defined by the plurality of organic light-emitting elements. This surrounding region may be also referred to as a frame region. If the same openings as those for the organic light-emitting elements are formed as dummy pixels not emitting light in the element isolation layer, the dummy pixels lie around the light-emitting region. In this instance, the hygroscopic layer may be disposed between the dummy pixels and the outermost organic light-emitting elements in the light-emitting region, or in a region closer to the edges of the light-emitting device than to the dummy pixels.

The hygroscopic layer used herein may be independent of and separate from the electron injection layer, or may be continuously formed with the electron injection layer as a matrix in one layer. By forming the hygroscopic layer and the electron injection layer as a single continuous layer, production thereof is simplified and their yield is increased.

The present inventors initially believed that in the structure in which the hygroscopic layer and the electron injection layer are integrated in a single layer, water absorbed into the hygroscopic layer might negatively affect the electron injection layer in the organic light-emitting element. However, it has been found that the water does not affect light emission to a significant extent because the water slowly penetrates in the in-plane direction.

An embodiment of the invention will now be described with reference to the drawings.

Figure 1B:
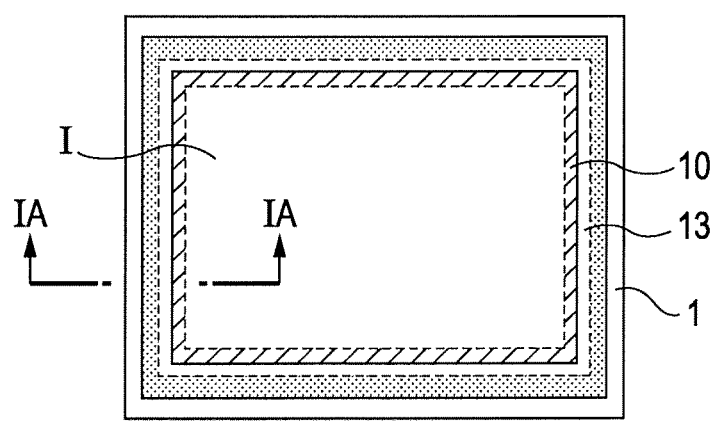
FIG. 1B is a schematic plan view of the organic light-emitting device.

FIG. 1A is a schematic sectional view of an end of an organic light-emitting device according to an embodiment of the invention, and FIG. 1B is a schematic plan view of the organic light-emitting device. FIG. 1A shows a cross-section taken along line IA-IA in FIG. 1B. As shown in FIGS. 1A and 1B, the organic light-emitting device includes a glass substrate (base) 1, TFTs (switching elements) 2, an insulating layer 3, a resin layer (planarizing layer) 4, anodes (positive electrodes) 5, a light-emitting layer 6, an electron injection layer 6', a cathode (negative electrode) 7, a hygroscopic member 8, a space 14 containing inert gas 9, an element isolation layer 10, a sealing glass 11, an adhesive 12, and a cathode-ground contact 13. Letter I designates a light-emitting region and letter O designates the region surrounding the light emitting region (hereinafter may be referred to as the light-emitting region-surrounding region or the surrounding region).

In the organic light-emitting device shown in FIGS. 1A and 1B, the TFTs 2, the insulating layer 3, and the resin layer 4 are formed on the glass substrate 1 in that order. The anode 5 is disposed on the resin layer for each pixel, and the pixels are surrounded by portions of a polyimide element isolation layer 10. The element isolation layer 10 is covered with the light-emitting layer 6 and the electron injection layer 6' in that order. In addition, the cathode 7 is formed over these layers. An organic compound layer may be composed of the two layers of the light-emitting layer 6 and the electron injection layer 6', or may further include a hole transport layer and an electron transport layer. By applying a voltage between the anode 5 and the cathode 7, the light-emitting layer 6 disposed between these electrodes emits light. The region that can emit light is defined as an organic EL portion. The outermost portions of the element isolation layer 10 in the light-emitting region-surrounding region O have a larger width than the other portions between the elements so as to permit variations in the in-plane direction of vapor deposition for forming the organic compound layer, or so as to protect a drive circuit disposed in the surrounding region. The cathode 7 is covered with a sealing glass 11 having a recess formed in the region corresponding to the light-emitting region by etching. The edges of the sealing glass 11 are sealed with an adhesive 12. The hygroscopic member 8 is formed on an inner wall of the sealing glass 11 on the organic compound layer side. The space 14 between the sealing glass 11 and the cathode 7 is filled with an inert gas 9.

In the embodiment shown in FIGS. 1A and 1B, the portion of the electron injection layer 6' over the element isolation layer 10 in the surrounding region O serves as the hygroscopic layer. Hence, the hygroscopic layer and the electron injection layer 6' are continuously formed in one layer. Preferably, the hygroscopic layer is disposed in the surrounding region O adjacent to the light-emitting region I, as shown in FIG. 1A. Thus, degradation can be reduced in the outer area of the light-emitting region.

By disposing the hygroscopic layer over the element isolation layer 10, water contained in the element isolation layer 10 is absorbed by the hygroscopic layer. Consequently, the element isolation layer 10 can be prevented from affecting the organic compound layer of the organic light-emitting element. Water contained in the resin layer 4 can also be absorbed by the hygroscopic layer through the element isolation layer 10, and consequently, the resin layer 4 can be prevented from affecting the organic compound layer.

Although in the embodiment shown in FIGS. 1A and 1B, the hygroscopic layer is formed along the four sides of the light emitting region I, it does not necessarily surround the light-emitting region. However, the hygroscopic layer surrounding the light-emitting region can advantageously prevent water from entering the light-emitting region I from all directions of the light-emitting region-surrounding region.

In FIG. 1A, the element isolation layer 10 and the hygroscopic layer are separated by a layer having the same composition as the light-emitting layer 6. This layer is formed by extending the light-emitting layer 6 by an area equivalent to one pixel. This is advantageous in increasing the tolerance of the alignment precision. In this instance, water can penetrate the layer having the same composition of the light-emitting layer 6, but the water probably does not affect the organic compound layer.

Figure 2:
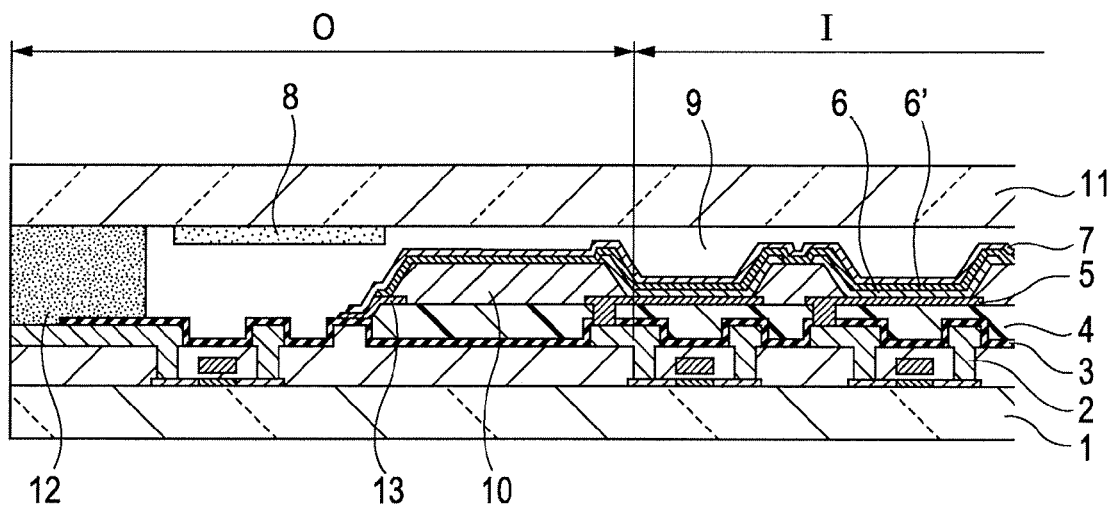
FIG. 2 is a schematic sectional view of an end of an organic light-emitting device according to another embodiment of the invention.

FIG. 2 is a schematic sectional view of an end of an organic light-emitting device according to another embodiment. The organic light-emitting device shown in FIG. 2 is different from the structure shown in FIGS. 1A and 1B in that the layer having the same composition of the light-emitting layer 6 is not formed on the outermost portion of the element isolation layer 10. In addition, the sealing glass 11 does not have a recess formed by etching, but is a flat plate. The other portions have the same structure as those of the embodiment shown in FIGS. 1A and 1B.

In the present embodiment, the hygroscopic layer is formed on and in contact with the element isolation layer 10, so that the hygroscopic layer can more easily absorb water. Consequently, the organic compound layer can be protected from the action of the water.

Figure 3:
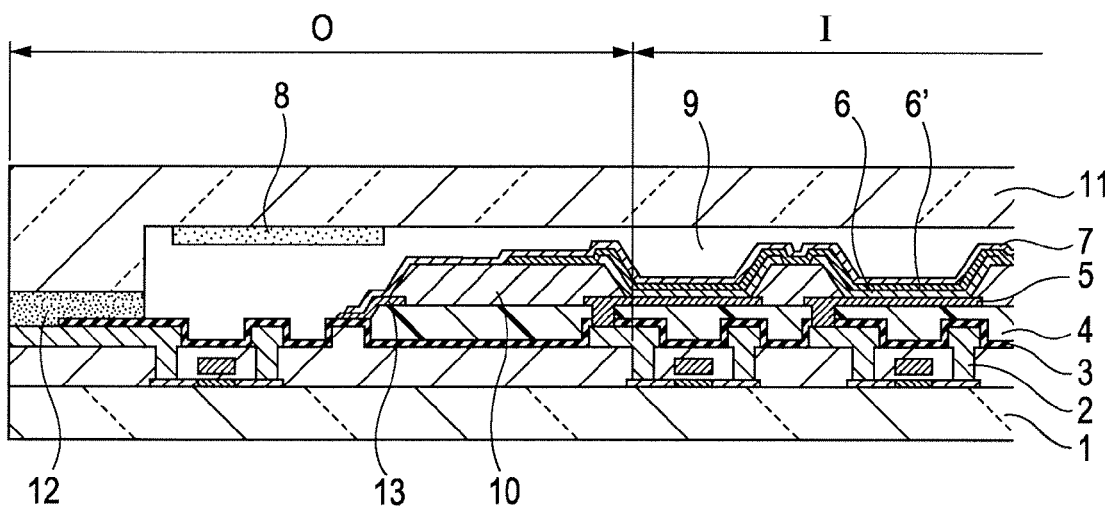
FIG. 3 is a schematic sectional view of an end of an organic light-emitting device according to another embodiment of the invention.

FIG. 3 is a schematic sectional view of an end of an organic light-emitting device according to another embodiment of the invention. The organic light-emitting device shown in FIG. 3 has the same structure as the structures shown in FIGS. 1A and 2 in that the hygroscopic layer and the electron injection layer 6' are continuously formed in one layer. However, the hygroscopic layer partially covers the top of the element isolation layer 10.

The hygroscopic layer of FIG. 3 absorbs less water contained in the element isolation layer 10 and the resin layer 4 than the hygroscopic layer shown in FIG. 1A or 2. However, the hygroscopic layer may not be necessarily formed over the entire top surface of the element isolation layer 10 as long as the hygroscopic layer can sufficiently reduce the negative effects on the organic EL portions. For example, the hygroscopic layer may cover 50% or more of the top surface of the element isolation layer 10 in the surrounding region, or a width of the element isolation layer 10 of 40 μm or more from the end of the light-emitting region I. The hygroscopic layer formed in such a range can produce the effect of the invention.

Figure 4:
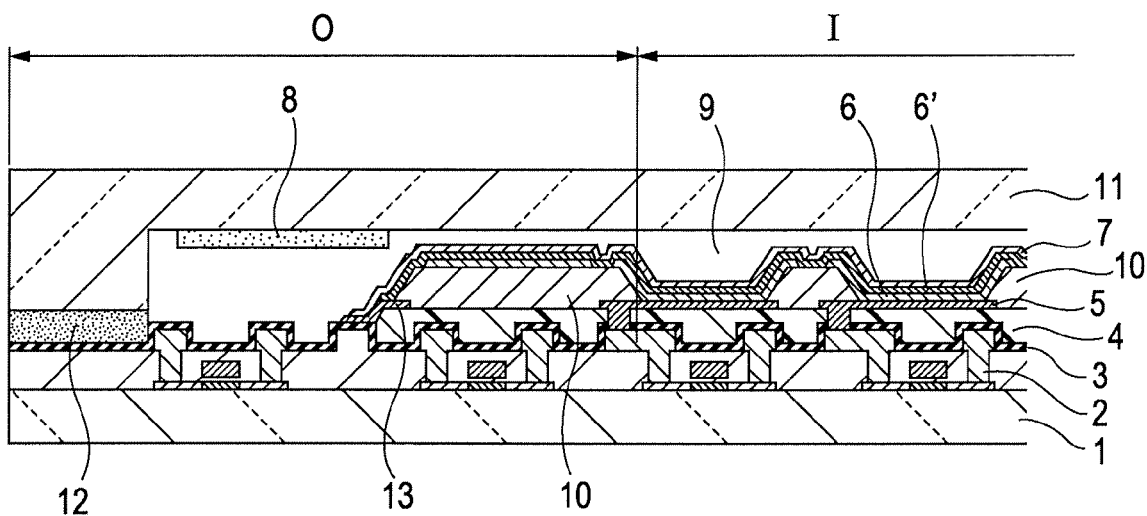
FIG. 4 is a schematic sectional view of an end of an organic light-emitting device according to another embodiment of the invention.

FIG. 4 is a schematic sectional view of an end of an organic light-emitting device according to another embodiment of the invention. The organic light-emitting device shown in FIG. 4 has a drive circuit for controlling the operation of the organic light-emitting elements between the glass substrate 1 and the resin layer 4 in the light-emitting region-surrounding region O. This structure allows the resin layer 4 and the element isolation layer 10 to protect the drive circuit from impacts during, for example, the manufacturing process.

Although the invention has been described with reference to the above embodiments, the organic light-emitting device is not limited to the structures described above. For example, while the lower electrode acts as the anode and the upper electrode acts as the cathode in the above structures, the lower electrode may be a cathode and the upper electrode may be an anode. In such a structure, after the lower electrode or cathode is formed, the electron injection layer is formed. If the electron injection layer and the hygroscopic layer are continuously formed in one layer, the hygroscopic layer covers the side walls of the openings of the element isolation layer. Consequently, the hygroscopic layer can reliably absorb water.

Figure 5:
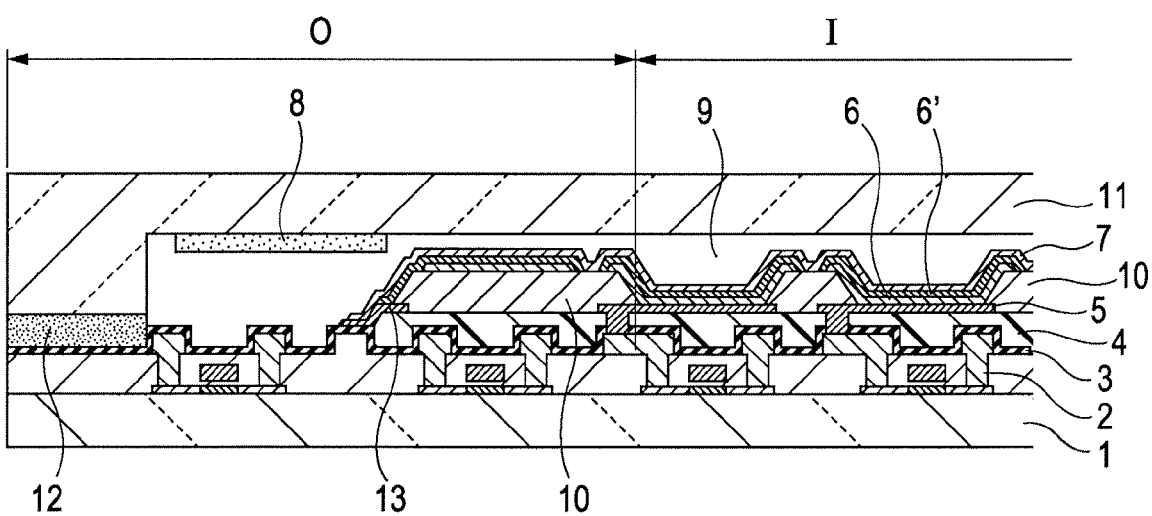
FIG. 5 is a schematic sectional view of an end of an organic light-emitting device according to another embodiment of the invention.

The electron injection layer and the hygroscopic layer may be formed separately from each other, as shown in FIG. 5. Since water slowly penetrates the electron injection layer and the hygroscopic layer in the in-plane direction, the penetration of water may not produce a serious effect even if the electron injection layer and the hygroscopic layer are continuously formed in a single layer. In order to reliably prevent the penetration of water, however, it is preferable that the hygroscopic layer is formed separately from the electron injection layer.

The structure of each embodiment above includes both the resin layer and the element isolation layer, and both of them are made of an organic material. However, the element isolation layer may be made of an inorganic insulating material. If the element isolation layer is made of an organic material, the resin layer may not be necessary. This structure can be applied to a passive matrix light-emitting device in which light is emitted from intersections of striped electrodes. In a structure in which at least either the resin layer or the element isolation layer is made of an organic material, water can degrade the outer area of the light-emitting region. The invention covers such structures.

The organic light-emitting device of the invention may have a top emission structure in which light is extracted through the substrate, or a bottom emission structure in which light is extracted through the opposite side to the substrate.

The organic light-emitting device can be advantageously used as the backlight of a liquid crystal display device if white light is emitted, and can be advantageously used as a display device if the light-emitting region includes a plurality of color light emitting portions emitting a plurality of colors such as RGB (red-green-blue).

The organic light-emitting device of the invention can be advantageously used in the displays of TV sets, PC monitors, and cellular phones. In particular, the organic light-emitting device can be advantageously used in the displays of mobile apparatuses, which may be used in a wide range of temperatures or humidities and are, accordingly, required to be highly resistant to environmental changes. Display devices using the organic light-emitting device of the invention can display high-quality images over a long term.

The organic light-emitting device of the invention can also be used in image pickup devices, such as digital cameras. Image pickup devices using the organic light-emitting device of the invention can display high-quality images over a much longer term.

EXAMPLES

Examples of the invention will now be described.

Example 1

Example 1 illustrates the preparation of the organic light-emitting device shown in FIGS. 1A and 1B.

The organic light-emitting device was prepared in accordance with the following procedure, and was subsequently evaluated as below.

Formation of Layers Underlying the Anode

TFTs (switching elements) 2 were formed on a glass substrate 1, and then an insulating layer 3 was formed so as to protect the TFTs 2. Subsequently, a resin layer 4 was formed of an acrylic material known in the trade as PC415G (produced by JSR) by spin coating so that the unevenness tending to result from the formation of a backplane of the TFTs was planarized. Then, the resin layer 4 was removed from the surrounding region by a wet process.

Formation of Anodes (Positive Electrodes)

Contact holes were formed in the insulating layer 3 and the resin layer 4 for electrical connection with the respective drain terminals formed in the TFT backplane. Then, a Cr electrode was formed to a thickness of 100 nm and subsequently wet-processed into anodes (positive electrodes).

Formation of Element Isolation Layer

Subsequently, the acrylic material known as PC415G (produced by JSR) for an element isolation layer 10 was deposited between the anodes and along the ends of the anodes by spin coating, and then the deposited layer was subjected to a wet process to form the element isolation layer 10.

Pretreatment

After being cleaned with UV light and ozone, the resulting substrate was vacuum-baked at $1 \times 10^{-2}$ Pa and 50° C. for 7 hours.

Then, the substrate was placed in a vapor deposition apparatus and the vapor deposition apparatus was evacuated. An RF power of 50 W was applied to a ring electrode disposed in a pretreatment chamber to clean the substrate with oxygen plasma. This treatment was performed under an oxygen pressure of 0.6 Pa for 40 seconds.

Formation of Hole Transport Layer

The substrate was transferred into a deposition chamber from the pretreatment chamber and the deposition chamber was evacuated to a vacuum of $1 \times 10^{-4}$ Pa. Then, α-NPD (α-naphthylphenyldiamine) was deposited to form a hole transport layer by resistance heating vapor deposition. The deposition rate was set at 0.2 nm/s and the thickness of the hole transport layer was 35 nm. The vapor deposition was performed through a metal grid mask so that the hole transport layer was formed for each pixel.

Formation of Light-Emitting Layer

Subsequently, an alkylate complex Alq3 (aluminum quinolinol) was deposited at a thickness of 15 nm on the hole transport layer by resistance heating vapor deposition under the same condition as in the deposition of the hole transport layer. This light-emitting layer was vapor-deposited through a metal grid mask so as to be provided for each pixel as in the deposition of the hole transport layer.

The metal grid mask had openings at a constant pitch in the region corresponding to the light-emitting region and its surrounding region so that the light-emitting layer could be formed in the region having the resin layer 4 and the element isolation layer 10 in the region surrounding the light-emitting region, as with the light-emitting layer 6 shown in FIG. 1A.

If R, G, and B light-emitting layers are independently disposed, these layers can be formed through their respective metal masks having patterns corresponding to their arrangements.

Formation of Electron Injection Layer and Hygroscopic Layer

Then, Alq3 and cesium carbonate ($Cs_2CO_3$) were deposited into an electron injection layer of 35 nm in thickness on the light-emitting layer by resistance heating vapor codeposition. In this codeposition, the vapor deposition rates of Alq3 and $Cs_2CO_3$ were adjusted so that the total deposition rate would be 0.3 nm/s and the thickness ratio would be 9:1.

The metal mask used for this electron injection layer had such openings as the element isolation layer 10 in the surrounding region O would be entirely covered with the electron injection layer, or hygroscopic layer.

The electron injection layer can be formed of at least one compound of alkali metals, alkaline earth metals, alkali metal compounds, or alkaline earth metal compounds. For example, cesium carbonate ($Cs_2CO_3$) or indium (In) may be used. The material of the electron injection layer is required to have the ability of electron injection and hygroscopicity. By providing the electron injection layer over the element isolation layer 10 in the surrounding region O, the electron injection layer in the surrounding region serves as the hygroscopic layer that absorbs remaining water. Thus, degradation in the outer area of the light-emitting region, which can be particularly serious, can be prevented.

Formation of Cathode (Negative Electrode)

The resulting substrate was transferred into an electrode sputtering chamber to form a cathode, and a transparent electrode acting as the cathode was formed to a thickness of 130 nm on the electron injection layer by DC magnetron sputtering using an ITO target through a metal mask.

This deposition was performed at room temperature with the substrate not heated, using Ar, $H_2O$, and $O_2$ gases at flow rates of 500, 1.5, and 5.0 sccm respectively. The deposition pressure was set at 1.0 Pa, and the power applied to the ITO target was set at 500 W. The transmittance was 85% (at 450 nm) and the specific resistance was $8 \times 10^{-4}$ Ω·cm.

As described above, the organic light-emitting element substrate was prepared by depositing the anodes, the hole transport layer, the light-emitting layer, the electron injection layer, and the cathode on the substrate 1 after the TFT backplane was formed on the substrate.

Sealing

In Example 1, a sealing layer was provided over the resulting organic light-emitting element substrate. The sealing layer can prevent, for example, water in the air from permeating the organic compound layer from the outside of the organic light-emitting element substrate. A flat glass plate or an etched glass having protrusions in regions to be bonded may be used as the sealing layer, and a cationic UV curable resin may be used to bond the sealing layer. Alternatively, an inorganic layer may be directly formed on the organic light-emitting element substrate. Such an inorganic sealing layer can be formed of a water-resistant and transparent material, such as SiN.

In Example 1, an etched glass was used as the sealing glass 11, and a Ca-based sheet getter was used as the hygroscopic member 8. The hygroscopic member absorbs water permeating through the adhesion portion of the organic light-emitting element substrate and the sealing layer.

The hygroscopic member 8 was bonded to a position outside the light-emitting region I of the sealing glass 11 in a glove box.

Then, the sealing glass 11 was bonded onto the organic light-emitting element substrate so that water in the air would not permeate to the organic light-emitting element substrate. In the present example, optical cationic polymerization liquid resin (trade name-KR695, produced by ADEKA) was used as the adhesive 12.

The adhesive was placed in a dispenser syringe and the sealing plate was placed into the glove box. The adhesive was applied to the outer edges of the sealing plate at a width of about 0.5 mm and a thickness of about 35 μm using a dispensing robot.

Then, the organic light-emitting element substrate was placed into the glove box, and the sealing plate was bonded to the organic light-emitting element substrate with the adhesive 12. At this time, the UV irradiation intensity was set at 100 mW/cm$^2$ and the light intensity was set at 3,000 mJ/cm$^2$.

The glove box used for the above sealing was controlled so that the water content in the box was 10 ppm or less.

Evaluation 1

The light emission of the resulting organic light-emitting device was checked immediately after the completion of production, and subsequently the organic light-emitting device was subjected to an endurance test in an atmosphere of 60° C. and 90% RH for 1,000 hours for the evaluation of long-term reliability. The endurance test showed that there was no degradation even in the outermost pixels in the light-emitting region I because of the presence of the hygroscopic layer over the element isolation layer in the light-emitting region-surrounding region O.

For comparison, another organic light-emitting element substrate having a known structure was prepared. This structure did not have a layer having the same composition as the organic light-emitting layer, the electron transport layer, or the electron injection layer 6' over the element isolation layer 10 in the surrounding region O. This structure was also subjected to the same endurance test under the same conditions. As a result, pixels up to the third from the outermost positions in the light-emitting region I were degraded.

Example 2

Example 2 prepared the organic light-emitting device shown in FIG. 2. The organic light-emitting device was produced in the following procedure, and subsequently evaluated as below.

In the same manner as in Example 1, TFTs (switching elements) 2 were formed on a glass substrate 1, and then an insulating layer 3 was formed so as to protect the TFTs 2.

Subsequently, a resin layer 4 was formed to planarize the unevenness resulting from the formation of the TFT backplane.

Then, anodes (positive electrodes) were formed under the same condition as in Example 1. After pretreatment, layers up to the hole transport layer were formed.

Formation of Light-Emitting Layer

Subsequently, an alkylate complex Alq3 was deposited at a thickness of 15 nm on the hole transport layer by resistance heating vapor deposition under the same conditions as in the deposition of the hole transport layer. This light-emitting layer was vapor-deposited through a metal grid mask so as to be provided for each pixel as in the deposition of the hole transport layer.

In Example 2, the light-emitting layer was formed only the light-emitting region, as in the known structure. Formation of electron injection layer and hygroscopic layer Then, Alq3 and cesium carbonate ($Cs_2CO_3$) were deposited into an electron injection layer of 35 nm in thickness on the light-emitting layer by resistance heating vapor codeposition. In this deposition, the vapor deposition rates of Alq3 and $Cs_2CO_3$ were adjusted so that the total deposition rate would be 0.3 nm/s and the thickness ratio would be 9:1.

The metal mask used for this electron injection layer had openings which caused the element isolation layer 10 in the surrounding region O to be entirely covered with the electron injection layer, or hygroscopic layer.

In the present example as well, the resin layer 4 was disposed not only in the inner region from the cathode-ground contact 13, but also in the outer region from the cathode-ground contact.

After forming the electron injection layer, a cathode was formed in the same manner as in Example 1, followed by sealing.

Evaluation 2

The light emission of the resulting organic light-emitting device was checked immediately after the completion of production, and subsequently the organic light-emitting device was subjected to an endurance test in an atmosphere of 60° C. and 90% RH for 1,000 hours for the evaluation of long-term reliability. The test result demonstrated there was no degradation, such as reduction of brightness or increase of driving voltage, even in the outermost pixels in the light-emitting region I.

In the Examples, the electron injection layer was made of a composite of Alq3 and $Cs_2CO_3$, but the layer is not limited to this composition. For example, the electron injection layer may be made of indium (In), an alkali metal oxide, or an alkaline earth metal oxide, and its material can be appropriately selected according to the material of the cathode.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2006-091226 filed Mar. 29, 2006 and No. 2007-030727 filed Feb. 9, 2007, which are hereby incorporated by reference herein in their entirety.

What is claimed is:

1. An organic light-emitting device comprising:
   a base;
   a plurality of thin film transistors disposed on the base;
   a resin layer disposed on the thin film transistors;
   a plurality of organic light-emitting elements disposed to form a light-emitting region on a surface of the resin layer, each organic light-emitting element including an anode, an organic compound layer including a light-emitting layer and an electron injection layer comprising at least one of an alkali metal, an alkaline earth metal, an alkali metal compound, or alkaline earth metal compound, and a cathode;

an element isolation layer surrounding each organic light-emitting element and contacting the organic compound layer of each organic light-emitting element; and a hygroscopic layer having the same composition as the electron injection layer, disposed over the element isolation layer in a region surrounding the light-emitting region.

2. The organic light-emitting device according to claim 1, wherein the portion of the element isolation layer in the region surrounding the light-emitting region has a larger width than the portions of the element isolation layer between any two adjacent organic light-emitting elements in the light-emitting region.

3. The organic light-emitting device according to claim 2, further comprising a drive circuit in the region surrounding the light-emitting region between the base and the element isolation layer, the drive circuit controlling the operation of the organic light-emitting elements.

4. The organic light-emitting device according to claim 1, wherein the electron injection layer and the hygroscopic layer form a continuous matrix in one layer.

5. The organic light-emitting device according to claim 1, wherein the electron injection layer and the hygroscopic layer are separate from each other.

6. The organic light-emitting device according to claim 1, wherein the hygroscopic layer surrounds the light-emitting region.

7. The organic light-emitting device according to claim 1, wherein the hygroscopic layer covers at least 50% of the width of the portion in the region surrounding the light emitting region of the element isolation layer.

8. The organic light-emitting device according to claim 1, wherein the hygroscopic layer covers a width of the element isolation layer of at least 40 µm from the end of the light-emitting region in the direction toward the outside of the light-emitting region.

9. The organic light-emitting device according to claim 1, wherein the element isolation layer is made of a polymer.

10. The organic light-emitting device according to claim 1, wherein the electron injection layer comprises an organic compound and at least one of an alkali metal, an alkaline earth metal, an alkali metal compound, or alkaline earth metal compound; and the hygroscopic layer has the same composition as the electron injection layer.

11. An organic light-emitting device comprising:
a base;
a plurality of organic light-emitting elements disposed to form a light-emitting region on a surface of the base, each organic light-emitting element including an anode, an organic compound layer including a light-emitting layer and an electron injection layer comprising at least one of an alkali metal, an alkaline earth metal, an alkali metal compound, or an alkaline earth metal compound, and a cathode;
an element isolation layer made of resin disposed on the base, the element isolation layer surrounding each organic light-emitting element and contacting the organic compound layer of each organic light-emitting element; and
a hygroscopic layer having the same composition as the electron injection layer, disposed over the element isolation layer in a region surrounding the light-emitting region.

12. An organic light-emitting device comprising:
a base;
a plurality of thin film transistors disposed on the base;
a resin layer disposed on the thin film transistors;
a plurality of organic light-emitting elements disposed to form a light-emitting region on a surface of the resin layer, each organic light-emitting element including an anode, an organic compound layer including a light-emitting layer and an electron injection layer comprising at least one of an alkali metal, an alkaline earth metal, an alkali metal compound, or alkaline earth metal compound, and a cathode in contact with the electron injection layer;
an element isolation layer surrounding each organic light-emitting element and contacting the organic compound layer of each organic light-emitting element; and
a hygroscopic layer disposed over the element isolation layer in a region surrounding the light-emitting region.

13. An organic light-emitting device comprising:
a base;
a plurality of thin film transistors disposed on the base;
a resin layer disposed on the thin film transistors;
a plurality of organic light-emitting elements disposed to form a light-emitting region on a surface of the resin layer, each organic light-emitting element including an anode, an organic compound layer including a light-emitting layer and an electron injection layer comprising at least one of an alkali metal, an alkaline earth metal, an alkali metal compound, or alkaline earth metal compound, and a cathode;
an element isolation layer surrounding each organic light-emitting element and contacting the organic compound layer of each organic light-emitting element; and
a hygroscopic layer comprising at least one of an alkali metal, an alkaline earth metal, an alkali metal compound, or alkaline earth metal compound and disposed over the element isolation layer in a region surrounding the light-emitting region.

14. An organic light-emitting device comprising:
a base;
a plurality of thin film transistors disposed on the base;
a resin layer disposed on the thin film transistors;
a plurality of organic light-emitting elements disposed to form a light-emitting region on a surface of the resin layer, each organic light-emitting element including an anode, an organic compound layer including a light-emitting layer and an electron injection layer comprising at least one of an alkali metal, an alkaline earth metal, an alkali metal compound, or alkaline earth metal compound, and a cathode;
an element isolation layer surrounding each organic light-emitting element and contacting the organic compound layer of each organic light-emitting element; and
a layer having the same composition as the electron injection layer, disposed over the element isolation layer in a region surrounding the light-emitting region.

* * * * *